United States Patent
Arslan et al.

(10) Patent No.: US 10,230,345 B1
(45) Date of Patent: Mar. 12, 2019

(54) SYSTEM, APPARATUS AND METHOD FOR PERFORMING AUTOMATIC GAIN CONTROL IN A RECEIVER FOR SHORT RANGE WIRELESS COMMUNICATIONS

(71) Applicant: Silicon Laboratories Inc., Austin, TX (US)

(72) Inventors: Guner Arslan, Austin, TX (US); Wentao Li, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 15/692,321

(22) Filed: Aug. 31, 2017

(51) Int. Cl.
| | |
|---|---|
| *H03F 3/19* | (2006.01) |
| *H03G 3/30* | (2006.01) |
| *H04B 1/26* | (2006.01) |
| *H04B 1/00* | (2006.01) |
| *H04B 1/10* | (2006.01) |
| *H04B 17/318* | (2015.01) |

(52) U.S. Cl.
CPC ............ *H03G 3/3036* (2013.01); *H03F 3/19* (2013.01); *H04B 1/0014* (2013.01); *H04B 1/1027* (2013.01); *H04B 1/26* (2013.01); *H04B 17/318* (2015.01); *H03F 2200/294* (2013.01); *H03F 2200/451* (2013.01)

(58) Field of Classification Search
CPC ............................ H04B 1/0014; H03G 3/3036
See application file for complete search history.

(56) References Cited

U.S. PATENT DOCUMENTS

| | | | | |
|---|---|---|---|---|
| 6,442,380 | B1 * | 8/2002 | Mohindra | H03G 3/3068 |
| | | | | 455/234.1 |
| 8,180,308 | B1 * | 5/2012 | Neng | H03G 3/3068 |
| | | | | 455/226.2 |
| 8,346,202 | B2 | 1/2013 | Coban et al. | |
| 9,172,344 | B2 | 10/2015 | Green et al. | |
| 2005/0047533 | A1 * | 3/2005 | Ruelke | H03G 3/001 |
| | | | | 375/345 |
| 2005/0250462 | A1 * | 11/2005 | Wu | H03G 3/3052 |
| | | | | 455/234.1 |

(Continued)

OTHER PUBLICATIONS

U.S. Appl. No. 15/287,892, filed Oct. 7, 2016, entitled "Automatic Gain Control (AGC) Circuit and Method to Control Amplifier Gain Based on a Duration of an Overload Condition", by Hendricus de Ruijter.

(Continued)

*Primary Examiner* — Jaison Joseph
(74) *Attorney, Agent, or Firm* — Trop, Pruner & Hu, P.C.

(57) ABSTRACT

In one example, a receiver includes: a low noise amplifier (LNA) to receive and amplify a radio frequency (RF) signal, the LNA having a first controllable gain; a mixer to down-convert the RF signal to an intermediate frequency (IF) signal; a programmable gain amplifier (PGA) coupled to the mixer to amplify the IF signal, the PGA having a second controllable gain; a digitizer to digitize the IF signal to a digitized signal; a digital signal processor (DSP) to process the digitized signal; a first detector to output a first detection signal having a first value in response to the IF signal exceeding a first threshold during a first detection period; and a controller to dynamically update a gain setting of one or more of the LNA and the PGA in response to the first detection signal.

17 Claims, 9 Drawing Sheets

(56) References Cited

U.S. PATENT DOCUMENTS

| | | | | |
|---|---|---|---|---|
| 2010/0261447 A1* | 10/2010 | Lu | ................. | H03G 3/3068 455/253.2 |
| 2012/0244825 A1* | 9/2012 | Green | ................. | H03G 3/3052 455/226.1 |
| 2012/0319774 A1* | 12/2012 | Ibrahim | ................. | H03G 3/3068 330/129 |
| 2013/0195215 A1* | 8/2013 | Manglani | ................. | H04B 17/318 375/295 |
| 2014/0218222 A1* | 8/2014 | Yamagata | ................. | H03G 3/3052 341/118 |

OTHER PUBLICATIONS

U.S. Appl. No. 15/609,337, filed May 31, 2017, entitled "System, Apparatus and Method for Performing Automatic Gain Control in a Receiver for a Packet-Based Protocol," by Abdulkerim L. Coban.

* cited by examiner

SYSTEM, APPARATUS AND METHOD FOR PERFORMING AUTOMATIC GAIN CONTROL IN A RECEIVER FOR SHORT RANGE WIRELESS COMMUNICATIONS

BACKGROUND

In radio receivers, an incoming radio frequency (RF) signal is received, typically by an antenna. The signal is then processed in a signal processing path of the receiver. General receive operations include amplification, filtering, downconversion, and digitization, resulting in a digitized signal that can then be digitally processed, such as demodulation for a particular modulation technique.

Many receivers include multiple amplifiers or other gain components. At least some of these gain components may be controlled. While many gain control techniques are known, such techniques can suffer from various impairments, including complexity and processing difficulties. One reason for difficulty in certain techniques is reliance on received signal strength indicator (RSSI) information, which is only available after digital processing of the signal, which in turn may lead to delays in updating the gain components, which can adversely impact receiver operation.

SUMMARY OF THE INVENTION

In one aspect, a receiver includes: a low noise amplifier (LNA) to receive and amplify a radio frequency (RF) signal, the LNA having a first controllable gain; a mixer to downconvert the RF signal to an intermediate frequency (IF) signal; a programmable gain amplifier (PGA) coupled to the mixer to amplify the IF signal, the PGA having a second controllable gain; a digitizer to digitize the IF signal to a digitized signal; a digital signal processor (DSP) to process the digitized signal; and a first detector. In an example, the first detector may output: a first detection signal having a first value in response to the IF signal exceeding a first threshold during a first detection period; a second detection signal having the first value in response to the IF signal exceeding a second threshold during a second detection period (where this second threshold is less than the first threshold); and a third detection signal having the first value in response to a sample of the IF signal that exceeds the first threshold. The receiver may further include a controller to dynamically update a gain setting of one or more of the LNA and the PGA in response to one or more of the first detection signal, the second detection signal and the third detection signal.

The controller may further dynamically update the gain setting of the one or more of the LNA and the PGA based on received signal strength indication information obtained from the DSP. The receiver may further include a second detector to output a fourth detection signal having the first value in response to the RF signal exceeding a third threshold during a third detection period. The receiver may further include a passive gain network coupled to receive the RF signal from an antenna, where the controller is further to update a gain setting of the passive gain network, based on the fourth detection signal. The controller may further update the gain setting of the one or more of the LNA and the PGA in an opposite direction to the update to the passive gain network gain setting. The controller may disable the second detector to reduce power consumption. The controller may dynamically update the gain setting of the one or more of the LNA and the PGA in a first direction in response to the second detection signal having a second value in response to the IF signal not exceeding the second threshold during the second detection period. The controller may dynamically update the gain setting of the one or more of the LNA and the PGA in the first direction in response to the first detection signal having the second value in response to the IF signal not exceeding the first threshold during the first detection period. The controller may further maintain a count based on a number of instances of the third detection signal having the first value during the first detection period.

In an example, the controller may be configured to: access a conversion table based on the count to obtain a number of gain steps; and access a storage to determine a gain setting of one or more of the LNA and PGA based on the number of gain steps. The controller may dynamically update the gain setting prior to a conclusion of the first detection period in response to the count reaching a maximum value. The controller may disable the dynamic update in response to detection of a frame within the digitized signal.

In another aspect, at least one computer readable storage medium includes instructions that when executed enable a system to: at a beginning of a packet communication, set a maximum gain setting for a plurality of gain components of a receiver; and during a preamble portion of the packet communication, reduce a gain setting for one or more of the plurality of gain components in response to: a count value exceeding a first count threshold, the count value corresponding to a number of samples of the packet communication within a first detection period that exceeds a first threshold; and a latched output signal to indicate that the packet communication exceeded the first threshold within the first detection period, if the count value does not exceed the first count threshold.

In an example, the storage medium further includes instructions that when executed enable the system to access a conversion table based on the count value to determine a number of gain steps for the gain setting reduction. The instructions may further enable the system to access a first schedule to identify an updated gain setting for the one or more of the plurality of gain components. In addition, the instructions may further enable the system to reduce a gain setting for a first gain component of the plurality of gain components in response to a second latched output signal to indicate that the packet communication exceeded a second threshold within a second detection period.

In another aspect, an apparatus includes: a RF front end circuit to receive and process a RF signal, the RF front end circuit having a first controllable gain; a downconverter to downconvert the RF signal to a second frequency signal; a programmable amplifier coupled to the downconverter to amplify the second frequency signal, the programmable amplifier having a second controllable gain; a digitizer to digitize the second frequency signal to a digitized signal; a DSP to process the digitized signal; a first detector to output a first detection signal having a first value in response to a sample of the second frequency signal exceeding a first threshold; a first counter to maintain a count of a number of the first detection signals having the first value; and a controller to dynamically update a gain setting of at least one of the RF front end circuit and the programmable amplifier in a first direction in response to the count being below a first count threshold and to update the gain setting of the at least one of the RF front end circuit and the programmable amplifier in a second direction in response to the count exceeding a second count threshold.

In an example, the controller is to access a first schedule based at least in part on the count to determine the gain setting update. The apparatus may further include a second detector to output a second detection signal having the first value in response to the RF signal exceeding a second threshold. The controller may access a second schedule based at least in part on the second detection signal having the first value to determine a further update to the gain setting of the RF front end unit.

DETAILED DESCRIPTION

Figure 1:
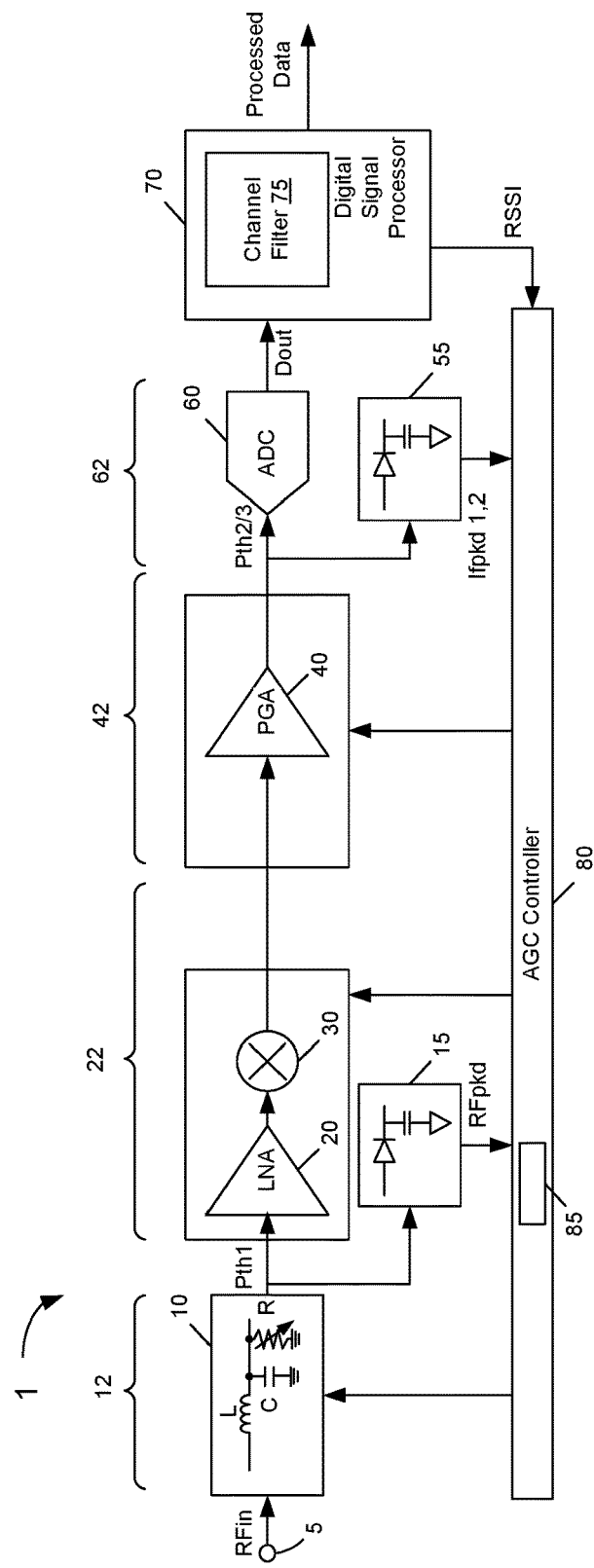
FIG. 1 is a block diagram of a receiver in accordance with an embodiment.

In various embodiments, a receiver is provided with techniques for performing automatic gain control (AGC) operation in a manner to quickly update gain settings of various gain components of the receiver so that communicated information is not lost. More specifically, embodiments may be used in receivers for a wide range of communication protocols in which AGC component updates can occur within a preamble portion of the packet communication, so that gain settings can be updated and finalized, prior to communication of actual payload data of the packet. As examples, packet-based protocols such as Bluetooth™, Zigbee™, as well as many other Internet of Things (IoT) protocols may leverage embodiments. Embodiments also may be applicable to receivers for constant amplitude modulated signals (such as frequency shift keying (FSK), Gaussian frequency shift keying (GFSK), offset quadrature frequency shift key (OQPSK), binary phase shift keying (BPSK), on-off keying (OOK), amplitude shift keying (ASK), minimum shift keying (MSK)), and other sub-gigahertz (GHz) IoT standards.

In particular examples described herein, a gain back-off technique may be used in which a gain control process is begun with maximum gain settings to provide maximum gain for multiple gain components of the receiver, and selectively one or more of these gain settings are reduced to other values, based on measured signal levels. In embodiments, the AGC techniques described herein may primarily perform gain control of the gain components using signal information obtained from power detectors within radio frequency (RF) and intermediate frequency (IF) sections of the receiver. Then, only optionally may received signal strength indicator (RSSI) information that is obtained from digitally processed signal information be used to (potentially) fine tune one or more of the gain components.

In embodiments, an AGC technique may be adapted to settle at the arrival of a packet before an actual payload starts. At the end of the process, gain is typically settled to a minimum level at which a required signal-to-noise ratio (SNR) (such as a SNR specified by a receiver manufacturer, or a SNR specified by a given communication protocol) is met with a few decibels (dB) of margin. In this way, the dynamic range of the receive chain is maximized and therefore the saturation of a receiver channel is prevented if a relatively strong blocker arrives during reception of desired data. In contrast to embodiments, conventional AGC algorithms use RSSI information to drive gain control. The settling of the RSSI after a gain change, however, is relatively slow as a signal passes through a complete receiver chain including a digital portion, including a digital channel filter. Also, visibility of a blocker location and its level are low in RSSI reading.

In embodiments, an AGC technique provides for multiple inputs to an AGC controller, namely from RF and IF power detectors. This information includes latched information to identify whether one or more threshold levels were exceeded in the RF and IF sections of the receiver. In addition to this latched information to identify threshold crossings or trips, at least the IF power detector may further provide information to obtain counter-based information to identify a number of samples within a given detection period that exceeds a corresponding threshold, to provide greater information as to potential saturation. With this incoming information from multiple sources, an AGC controller may operate using multiple semi-independent gain schedules to flexibly control gain settings of multiple gain stages at various points of a receiver chain.

Different control implementations are possible. In some cases, information from the RF power detector may be used to control gain settings of a front end passive network only. In other cases, such gain control also may be combined with a corresponding control of gain settings of additional gain components of the receiver, e.g., in an opposing direction so that signal quality is not impaired. That is, it is possible to rebalance gains by controlling gain settings of RF-based gain components such as the passive network in one direction (e.g., reducing the passive network's gain settings), while at the same time updating the gain settings of one or more IF-based gain components (e.g., increasing one or more gain settings). In this way, a faraway blocker may have less impact on receiving and processing of a given RF signal at RF levels, while in turn the additional gain control added within the IF sections may enable a desired IF signal to be seen and processed. Still further, using information from the IF power detector, gain control to both the front end passive network and additional gain components of the receiver may be effected. In this way, different inputs streams can be used to control the same gain components of the receiver.

In some embodiments, a rate of AGC updates may be slowed or stopped to avoid various undesired effects, including co-channel interference, hysteresis concerns and oscillation events. In some embodiments, certain triggers such as detection of a payload portion of an incoming data communication (e.g., a frame, a desired signal or so forth), may act as the trigger to this controllable AGC frequency control and/or disability. Furthermore, using an IF power detector as described herein that provides both latched information and counter-based information, a so-called blind spot problem, where a blocker signal at a blocking frequency may not be detected by a counter-based technique, can be resolved.

Embodiments may further provide for rapid gain settling by updating one or more gain control settings even during a given detection period when counter-based information exceeds a given threshold. Still further, enhanced receiver performance may be realized by providing for flexible gain scheduling. That is, in contrast to many conventional AGC techniques, gain control of different gain components may occur in a flexible manner. For example, gain components in different portions of the receiver may be updated without first exhausting gain control of a most downstream gain component. As an example, this flexible scheduling may cause gain settings to be updated in an upstream direction, starting from a most downstream gain component and moving up therefrom, and then proceeding in the other direction for additional gain setting changes. In this way, selectivity performance may be improved.

Further, for power management considerations, it is possible to dynamically control enabling of the RF power detector. In some cases, this control may be based on available power sources and/or presence of blockers that may more suitably be detected using information from the RF power detector.

Referring now to FIG. 1, shown is a block diagram of a receiver in accordance with an embodiment. As shown in FIG. 1, receiver 1 is a radio receiver having an input node. In various embodiments, input node 5, which may be an input pin of an integrated circuit (IC) including the receiver, receives an incoming RF signal (RFin) from a given antenna. As seen, the RF signal is provided to an attenuator 10. In an embodiment, attenuator 10 may be implemented as a passive gain network, e.g., including an inductor (L) and parallel-coupled capacitance (C) and resistance (R). In different embodiments, one or more of these RLC components can be dynamically controlled to control an amount of attenuation, such that attenuator 10 is considered one of the gain components of receiver 1. Note that attenuator 10 constitutes a first gain control region 12 of receiver 1. Although embodiments are not limited in this regard, in one particular embodiment attenuator 10 may provide for a controllable gain range of approximately 26 dB (e.g., with 2 dB steps per update). In one embodiment, the resistance R may be dynamically controlled to adjust the gain setting of first gain control region 12.

After any attenuation in attenuator 10, the RF signal is provided to a low noise amplifier (LNA) 20. After amplification in LNA 20, the RF signal is provided to a mixer 30. In various embodiments, mixer 30 may downconvert the RF signal to an IF signal. Understand that as used herein the terms "intermediate frequency" and "IF" are used to refer to signals downconverted from an RF level to a lower frequency, and includes IF, low IF and zero IF signals. Note that LNA 20, mixer 30 constitute a second gain control region 22 of receiver 1. Although embodiments are not limited in this regard, in one particular embodiment, second gain control region 22 (and in some cases specifically LNA 20) may have a controllable gain range of approximately 18 dB (e.g., with two dB steps).

The RF signal after attenuation in attenuator 10 is further provided to a first power detector 15, which operates as a wide-band detector to compare the power of the RF signal output from attenuator 10 to a first threshold (Pth1). In a particular embodiment, first power detector 15 may be implemented as a RMS power detector. When the RF signal level exceeds this threshold, power detector 15 outputs an active detection signal, RFpkd, which in an embodiment may be a latched signal such that when set via a trip remains set until it is controllably reset. As seen this detection signal is sent to an AGC controller 80, details of which are described below. Although embodiments are not limited in this regard, in one particular embodiment this first threshold Pth1 may be set at approximately −15 dBm. Of course other values are possible in other embodiments.

Still with reference to FIG. 1, the output of mixer 30 is provided to a programmable gain amplifier (PGA) 40. In the embodiment shown, PGA 40 constitutes a third gain control region 42. Although embodiments are not limited in this regard, in one particular embodiment third gain control region 42 may have a controllable gain range of 20 dB (e.g., with two dB steps).

Note that the IF signal output from PGA 50 is provided to a digitizer, namely an analog-to-digital converter (ADC) 60. As further illustrated, this IF signal is further provided to another power detector 55, which in the embodiment shown is an IF power detector. In one embodiment, IF power detector 55 may be implemented as a peak detector. Power detector 55 operates as a narrowband detector to compare this IF signal power to multiple thresholds, including a low threshold (Pth2) and a high threshold (Pth3). In one embodiment, this second threshold Pth2 may be set at approximately −3.0 dBm. In one embodiment, this third threshold Pth3 may be set at approximately −0.5 dBm, although of course other values are possible. Note that in other embodiments, power detector 55 may be implemented with only a single threshold for comparison, as described further below. As with the discussion above, when the IF signal level exceeds a given threshold, power detector 55 outputs an active detection signal, $IFpkd_{1,2}$, to AGC controller 80. In embodiments, one or more of these active detection signals may be latched signals as described above. In addition, power detector 55 may also provide additional detection signals to AGC controller 80. These detection signals may be active detection signals that are sent from power detector 55 to AGC controller 80 whenever a sample of the IF signal exceeds the high threshold. More specifically, in a receiver such as receiver 1 implemented as a complex receiver, an active detection signal may be sent per sample when the corresponding I or Q sample exceeds the high threshold.

Still referring to FIG. 1, the digitized output of ADC 60 (Dout) is provided to a digital signal processor (DSP) 70. In an embodiment, ADC 60 may be controlled to provide a small amount of attenuation, which may be used as a last resort in an AGC algorithm. As illustrated, channel filtering may be performed in a channel filter 75. Furthermore, DSP 70 may analyze the channel filtered output to determine RSSI information which, as described herein, may be used to perform fine tuning of one or more of the gain components, in certain cases. DSP 70 may also digitally process and output processed data.

AGC controller 80, in an embodiment, may be implemented as a dedicated microcontroller or other programmable hardware control circuit such as programmable logic. In other cases, AGC controller 80 may be implemented using other hardware circuitry, firmware, software and/or combinations thereof to control gain settings of various gain components within receiver 1 based on the detected outputs from power detectors 15 and 55. Furthermore, understand that AGC controller 80 may efficiently perform this gain control within a small time window, e.g., completely within a preamble portion of a data communication, such that no payload data of the communication is lost.

As further illustrated, AGC controller 80 includes a storage 85, which in embodiments may be implemented as a non-volatile storage or other non-transitory storage medium. Non-volatile storage 85 may store one or more tables including a plurality of entries, each to store a schedule that provides gain setting updates for the various gain components of receiver 1. Thus under control of gain controller 80, a selected group of settings can be accessed and used to update the gain settings of the corresponding gain components within receiver 1.

Figure 2:
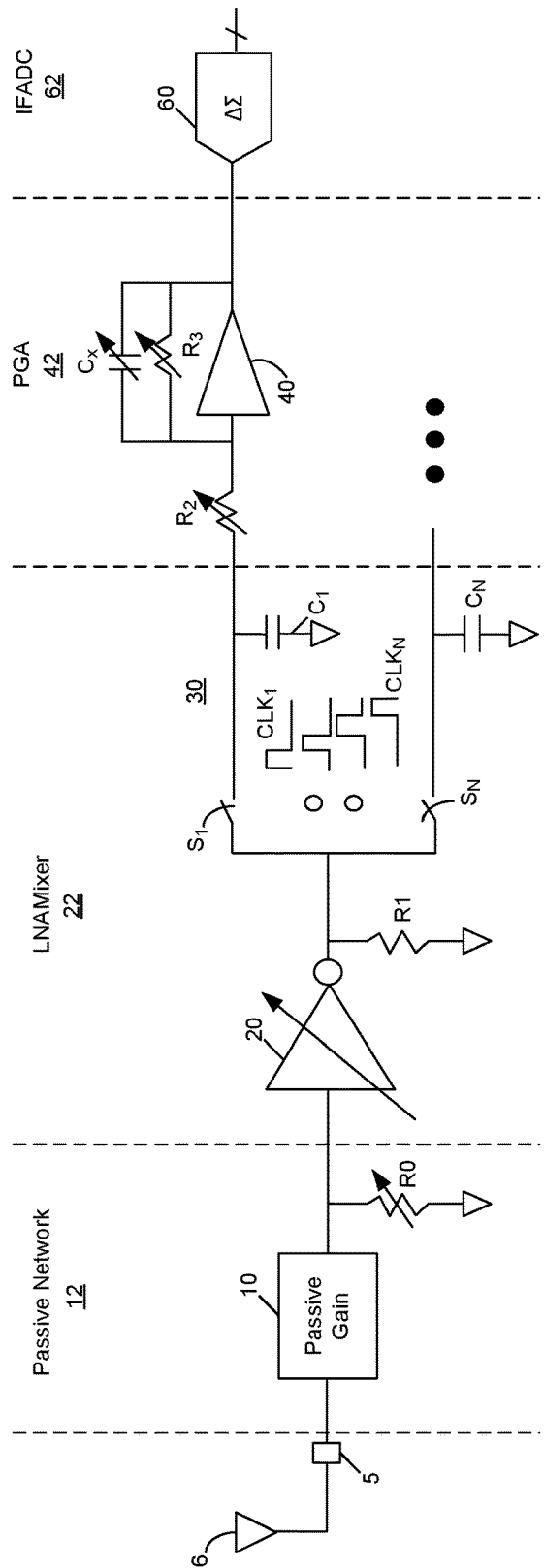
FIG. 2 is a schematic diagram of various gain stages of a receiver in accordance with an embodiment.

Referring now to FIG. 2, shown is a schematic diagram of various gain stages of a receiver in accordance with an embodiment. As shown in FIG. 2, receiver 1 may generally correspond to receiver 1 of FIG. 1. In this illustration, further details of various gain stages within receiver 1 are shown. As seen, an incoming RF signal is received via an antenna 6 and couples to receiver 1 via an on-chip connection 5, such as a pin. The incoming RF signal is provided to a passive gain network 10, which in an embodiment may be implemented as an RLC network with corresponding inductance, capacitance and a controllable resistance R0.

The output of passive gain network 10 is provided to a LNA 20, which may have a programmable gain. A resistance R1 is coupled between the output of LNA 20 and a reference voltage node (e.g., ground). In turn, the amplified RF signal output by LNA 20 is provided to a mixer 30. In the embodiment shown, mixer 30 may be implemented as a plurality of parallel switches $S_1$-$S_N$. In one example, switches $S_1$-$S_N$ may be implemented as metal oxide semiconductor field effect transistors (MOSFETs). Each switch may be controlled by a corresponding clock signal $CLK_1$-$CLK_N$ that thus acts as a mixing signal, e.g., at a given local oscillator (LO) frequency. As further shown, corresponding capacitors C1-Cn couple between the output of corresponding switches $S_1$-$S_N$ and the reference potential node.

The output of mixer 30 is thus a downconverted signal, e.g., at a given IF level. In turn, this IF signal may be amplified in a programmable gain amplifier (PGA) 40 that includes a series resistance R2 and a parallel RC network formed of resistor R3 and capacitor $C_X$ coupled in parallel between an input and an output of PGA 40. In turn, this IF amplified signal output by PGA 40 is provided to an ADC converter 60, which in an embodiment may be implemented as a delta-sigma converter. Note that in some embodiments, a programmable amount of gain may be realized within ADC 60. For example, a fine tuning of gain can occur by appropriate control of ADC 60.

Referring now to Table 1 below, shown is a representation of gain ranges for the various gain stages of receiver 1. Understand while shown with these particular values for purposes of illustration, different gain values, ranges and step sizes may occur in other embodiments.

TABLE 1

|  | Passive Network | LNA/Mixer | PGA | ADC |
|---|---|---|---|---|
| Maximum Gain (dB) | 12 | 18 | 26 | 0 |
| Minimum Gain (dB) | −14 | 0 | 6 | −6 |
| Range (dB) | 26 | 18 | 20 | 6 |
| Step Size (dB) | 2 | 2 | 2 | 2 |

In embodiments, multiple schedules that provide for selectable control of particular gain components of a receiver may be provided. In turn, an AGC controller or other control circuit may be configured to access these schedules based on information from multiple inputs, such as the above-described RF and IF detector-based information. In some embodiments, a first schedule may be provided for independent control of one or more gain components within RF circuitry of a receiver (e.g., a passive network). More specifically, information from an RF detector may be used to access this first schedule and perform corresponding control of gain settings for such RF gain components. In addition, a second schedule may be provided for independent control of one or more gain components within IF circuitry of the receiver (and potentially also the LNA and passive network). More specifically, information from an IF detector may be used to access this second schedule and perform corresponding control of gain settings for various gain components.

Referring now to Table 2, shown is a representation of a gain schedule for a passive network in accordance with an embodiment. More specifically as shown in Table 2, control of a passive network gain setting is based on an output of an RF power detector. The schedule shown correlates an RF AGC index to a corresponding passive network index. In the embodiment shown, a linear mapping is provided. As seen, each increment in RF AGC index (e.g., from one to two) is a corresponding decrease in gain setting from a maximum gain setting towards a minimum gain setting. In an embodiment, each step (RF AGC index) provides for a 2 dB gain step change (such that the actual gain redirections represented by the passive network index is 2× the value shown). For example, traversing from RF AGC index 9 to RF AGC index 10 corresponds to a reduction in gain setting for the passive network by 2 dB.

TABLE 2

Schedule (RFPKD)

| RF AGC Index | Passive Network Index |
|---|---|
| 1 | 1 |
| 2 | 2 |
| 3 | 3 |
| 4 | 4 |
| 5 | 5 |
| 6 | 6 |
| 7 | 7 |
| 8 | 8 |
| 9 | 9 |
| 10 | 10 |
| 11 | 11 |
| 12 | 12 |
| 13 | 13 |
| 14 | 14 |

Referring now to Table 3, shown is an example format for a gain schedule for IF (and RF) components in accordance with an embodiment based on IF power detector outputs. More specifically as shown in Table 3, control of gain settings for various gain components is based on an output of an IF power detector. The schedule shown correlates an IF AGC index to a corresponding gain index for various gain components. As seen, a greater range of indices are possible (namely IF AGC index may progress from index 1 to index 35). In turn, for any single step (assuming a step-wise progression), only a single gain component has its gain setting changed. Specifically as shown, for a first number of gain steps, a PGA may be controlled based on a given PGA index. Thereafter, LNA/mixer components may have their gain settings controlled. Next, the passive network may have its gain settings updated. Thereafter for additional gain steps, the LNA mixer, thereafter the PGA, and then finally the ADC may have their gain settings updated. Thus as illustrated, instead of saturating gain control of the PGA before moving onto the LNA/mixer (and similarly from the LNA/mixer to the passive network), gain changes occur flexibly to the different gain components in a swizzling-type fashion. This flexibility of AGC schedule may provide for improved receiver performance. Understand while shown in Tables 2 and 3 with particular indexes and corresponding gain settings, such schedules are provided for purposes of illustration, and a wide variety of particular gain schedules may be provided in different embodiments.

TABLE 3

Schedule (IFPKD)

| IF AGC Index | Passive Network Index | LNA Mixer Index | PGA Index | ADC Index |
|---|---|---|---|---|
| 1 | 1 | 1 | 1 | 1 |
| 2 | 1 | 1 | 2 | 1 |
| 3 | 1 | 1 | 3 | 1 |
| 4 | 1 | 1 | 4 | 1 |
| 5 | 1 | 1 | 5 | 1 |
| 6 | 1 | 1 | 6 | 1 |
| 7 | 1 | 1 | 7 | 1 |
| 8 | 1 | 1 | 8 | 1 |
| 9 | 1 | 2 | 8 | 1 |
| 10 | 1 | 3 | 8 | 1 |
| 11 | 1 | 4 | 8 | 1 |
| 12 | 1 | 5 | 8 | 1 |
| 13 | 1 | 6 | 8 | 1 |
| 14 | 1 | 7 | 8 | 1 |
| 15 | 2 | 7 | 8 | 1 |
| 16 | 3 | 7 | 8 | 1 |
| 17 | 4 | 7 | 8 | 1 |
| 18 | 5 | 7 | 8 | 1 |
| 19 | 6 | 7 | 8 | 1 |
| 20 | 7 | 7 | 8 | 1 |
| 21 | 8 | 7 | 8 | 1 |
| 22 | 9 | 7 | 8 | 1 |
| 23 | 10 | 7 | 8 | 1 |
| 24 | 11 | 7 | 8 | 1 |
| 25 | 12 | 7 | 8 | 1 |
| 26 | 13 | 7 | 8 | 1 |
| 27 | 14 | 7 | 8 | 1 |
| 28 | 14 | 8 | 8 | 1 |
| 29 | 14 | 9 | 8 | 1 |
| 30 | 14 | 10 | 8 | 1 |
| 31 | 14 | 10 | 9 | 1 |
| 32 | 14 | 10 | 10 | 1 |
| 33 | 14 | 10 | 11 | 1 |
| 34 | 14 | 10 | 11 | 2 |
| 35 | 14 | 10 | 11 | 3 |

Figure 3:
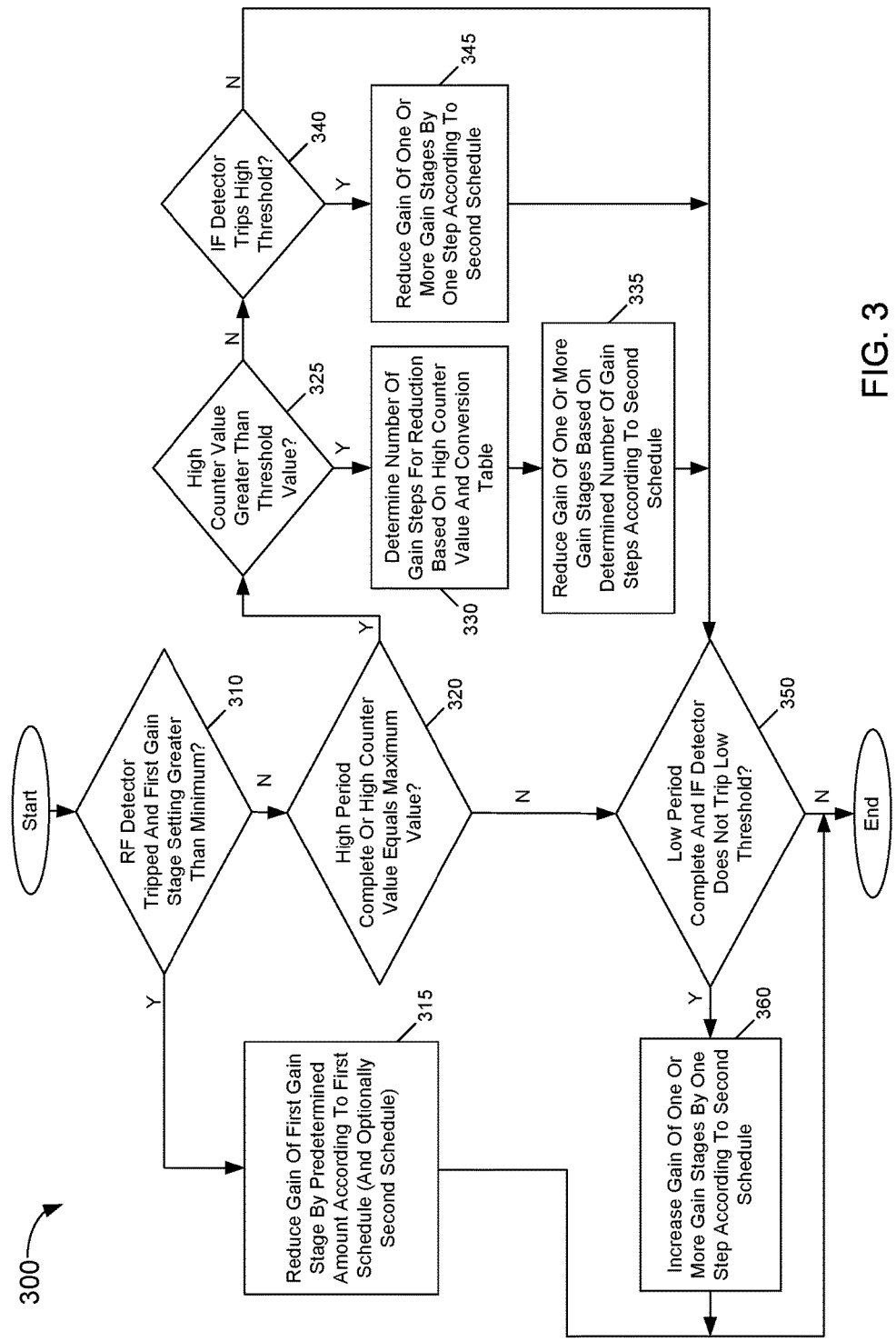
FIG. 3 is flow diagram of a method in accordance with an embodiment.

Referring now to FIG. 3, shown is flow diagram of a method in accordance with an embodiment. More specifically, method 300 shown in FIG. 3 is a method for controlling gain settings of various gain components of a receiver using an AGC controller as described herein. More specifically, method 300 is shown at a high level for consideration of updates to various gain settings based on information from RF and IF detectors. Note however that an AGC algorithm in accordance with an embodiment may include many additional functions, including providing for and updating of multiple counters associated with detection periods, count values and so forth, which are not shown in this high level of FIG. 3. Method 300 may be performed by hardware circuitry, firmware, software and/or combinations thereof.

As illustrated, method 300 begins by determining whether an RF detector has tripped (namely has crossed a given threshold) (diamond 310). Or in other cases this determination may be when the RF detector has tripped for N consecutive samples. Furthermore it is determined whether a first gain stage (namely a passive network) setting is at a setting greater than a minimum value. If so, control passes to block 315 where the gain of this first gain stage may be reduced by a predetermined amount according to a first schedule (and optionally a second schedule). Note that this first schedule is an RF detector-based schedule such as shown in Table 2, while the optional second schedule is an IF-detector-based schedule such as shown in Table 3. Although embodiments may vary, in a particular embodiment this predetermined amount of gain reduction may be a 6 dB gain reduction. To this end, with the linear mapping of Table 2, a change of three index positions (e.g., from index 2 to index 5) may occur to enable a corresponding gain setting to be reduced by 6 db.

Still with reference to FIG. 3 instead if it is determined that there is no tripping of the RF detector (or the first gain stage is at its minimum setting), control passes to diamond 320 to determine whether a high period has completed or a high counter value equals a maximum value. This high period may be a given detection period at which an IF peak detector high threshold output is analyzed. The high counter is a counter that counts the number of samples within this high period that exceeded a high threshold. If the determination at diamond 320 is in the affirmative, control passes to diamond 325 to determine whether the value of the high counter is greater than a threshold value. In one embodiment, this threshold value may be a value of zero, such that the determination at diamond 325 is whether the IF detector detected at least one sample that exceeded the high threshold. If so, control passes to block 330 where a number of gain steps for reduction can be determined based on the high counter value and a conversion table. More specifically, a conversion table may be provided to enable a non-linear mapping between the high counter value and the corresponding number of gain steps. In one embodiment, the conversion table may be in accordance with Table 4 below. Thus with reference to Table 4, assuming a high counter value of five, four gain steps may be determined. After this determination at block 330, control passes to block 335 where the gain of one or more gain stages may be reduced based on the determined number of gain steps according to the second schedule. Thus depending upon where in the schedule the current IF AGC index is and the number of gain steps to occur, one or more of PGA, LNA/mixer and passive network (and optionally ADC) can have its gain setting updated.

TABLE 4

| Count Value | Steps |
|---|---|
| 6 | 6 |
| 5 | 4 |
| 4 | 2 |
| 1 | 1 |

Still with reference to FIG. 3, if at diamond 325 it is determined that the high counter value is not greater than the threshold value, control passes to diamond 340 to determine whether the IF detector trips the high threshold during the detection period. In an embodiment, upon a single tripping of the IF detector, meaning that the sampled IF signal exceeded the high threshold, a latched output is set. If this IF detector trips the high threshold as determined at diamond 340, control passes to block 345 where a given one or more gain stages can have its gain reduced by one step according to the second schedule. And still with reference to FIG. 3 instead if the IF detector does not trip the high threshold during the detection period, no gain update occurs in this path.

Still with reference to FIG. 3, control passes to diamond 350 to determine whether a low period has completed. This low period may correspond to a detection period at which an IF detector low threshold output is analyzed. Also at diamond 350, it is determined whether the IF detector does not trip the low threshold. Thus if the detection period has completed and there has been no tripping of the low threshold, control passes to block 360 where the gain of one or more gain stages may be increased by one step according to the second schedule. Otherwise, for this low detection period, no gain update occurs. In other cases this determination may be whether the IF detector does not trip the low threshold for N consecutive low periods. Understand while shown at this high level in the embodiment of FIG. 3, many variations and alternatives are possible.

For example, in other embodiments instead of leveraging information from a detector that compares a signal level to multiple thresholds, AGC control may be performed based on information using a single threshold. As one such example, assume that an IF detector is implemented with a single threshold for comparison. In this example, a count may be maintained for a number of samples within a given detection period that exceeds this threshold. Control then may be based on whether this count value is within a desired window. For example, multiple count thresholds, such as a low and high count thresholds may be provided. At the conclusion of the detection period it can be determined whether the count of IF detection signals that exceed the single threshold is within these two thresholds. If so, no gain control update occurs. Otherwise a gain control update is performed in one of two directions, depending upon whether the count is below the low count threshold or above the high count threshold. In one particular example, assume that the low count threshold is three and the high count threshold is ten. If during a detection window the detector identifies at least three samples above the single threshold but less than ten samples above this same threshold, no gain update occurs. If the count is instead below three or above ten, a gain update occurs.

Referring now to FIGS. 4A-4D, shown is a flow diagram of method in accordance with another embodiment. More specifically, this flow diagram shows a detailed method for performing AGC operations, including control of counters associated with various detection periods and a detection counter for samples detected above a given threshold. In embodiments, the method shown in FIGS. 4A-4D may be performed by an AGC controller, as discussed above. The portion of method 400 shown in FIG. 4A primarily relates to control of IF detection periods (namely low and high IF detection periods) and updating the high counter should an IF detection signal exceed the high threshold.

As illustrated, method 400 begins by determining whether there was a prior gain change or a high period equals zero (meaning that the high threshold detection period for the IF detector has completed) (diamond 410). If this is the case, control passes to block 415 where the high period is set to a predetermined value (e.g., N). Note that if the determination at diamond 410 is in the negative, instead the high period is decremented at block 420.

Figure 4A:
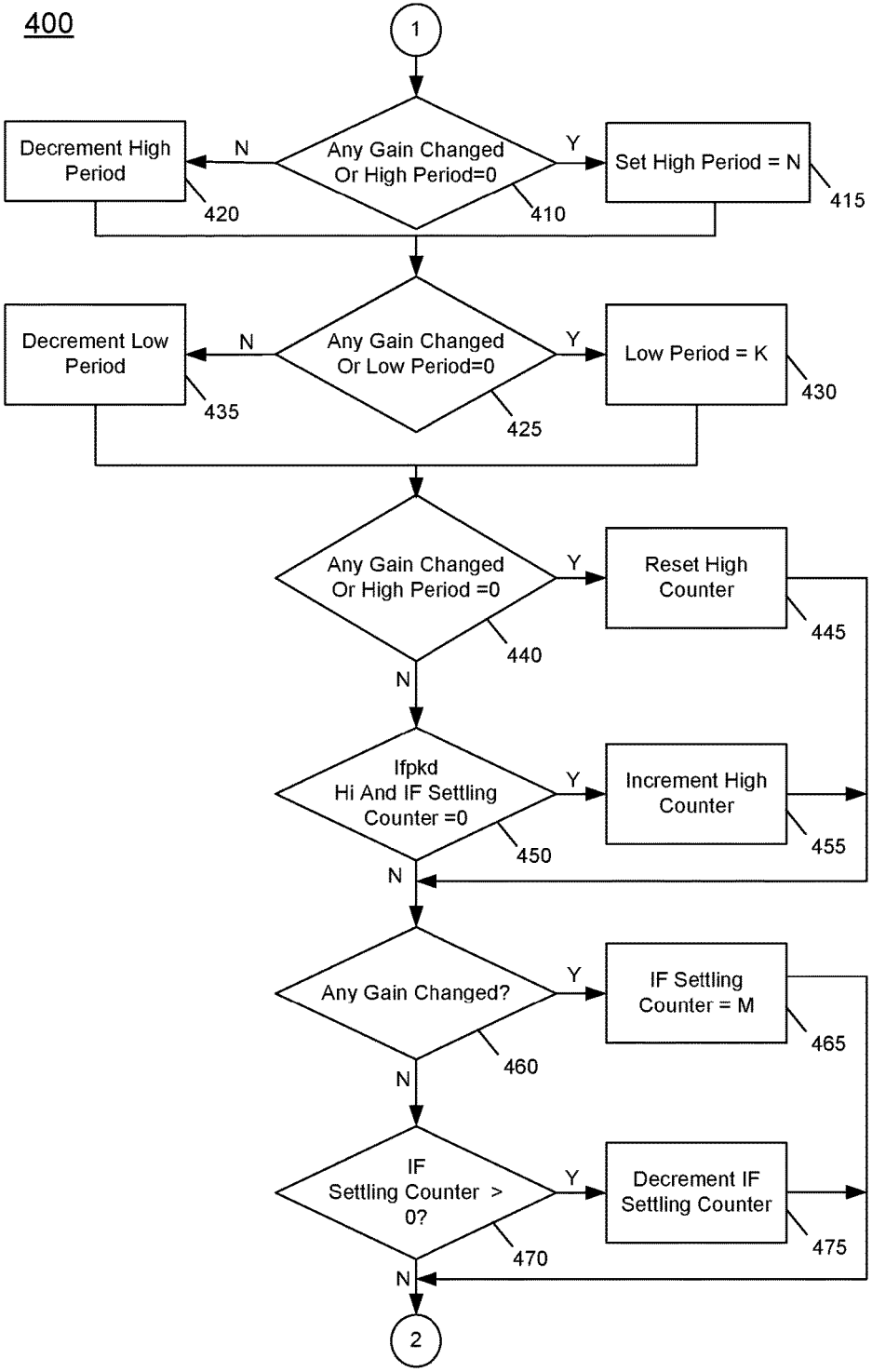
FIGS. 4A-4D are a flow diagram of a method in accordance with another embodiment.

Still with reference to FIG. 4A, control next passes to diamond 425 where it is determined whether there was a prior gain change or a low period equals zero (meaning that the low threshold detection period for the IF detector has completed). If this is the case, control passes to block 430 where the low period is set to a predetermined value (e.g., K, which may be set to a larger value than N (the high period)). Note that if the determination at diamond 425 is in the negative, instead the low period is decremented at block 435.

Next, control passes to diamond 440 where it is determined whether any gain has changed or the high period is zero. If so, control passes to block 445 where a high counter, which is a counter that counts the number of IF samples that exceeds the IF high threshold within the IF high detection period, is reset to zero. Thus new counting for the next IF high detection period can begin from this reset level. If instead at diamond 440 there is no gain change or no high period reset is detected, control passes to diamond 450 where it is determined whether the IF detector high latched output is set and an IF settling counter is of a zero value. Note that this IF settling counter represents a value of a duration after a gain change in the IF section in which no IF detection-based analysis is to occur, as the prior gain change is still settling in the receiver. If the determination at diamond 450 is in the affirmative, the high counter value is incremented at block 455.

Still with reference to FIG. 4A, next at diamond 460 it is determined whether any gain has changed. If so, at block 465 the IF settling counter may be set to a predetermined value (e.g., M). Otherwise if it is determined at diamond 470 that the IF settling counter exceeds zero, a decrement of the IF settling counter occurs at block 475.

Figure 4B:
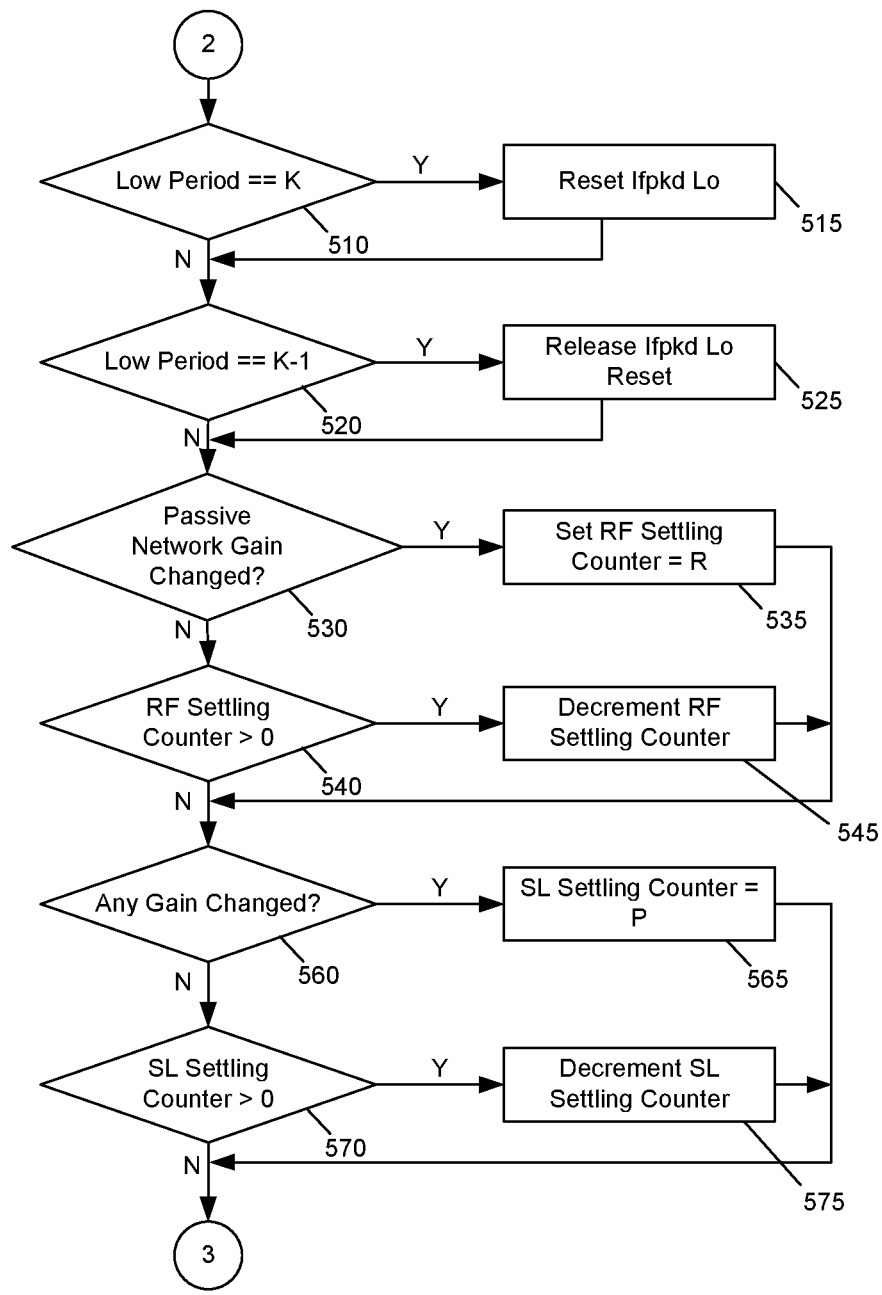

Referring now to FIG. 4B, shown generally are further counter control and update operations, along with possible resets of the IF detector (more specifically the low latched output of the IF detector). Thus as illustrated in FIG. 4B, control next passes to diamond 510 to determine whether the low period has reached near its maximum value corresponding to the duration of the low detection period. If so, control passes to block 515 where the IF detector low latched output is reset. Thereafter if it is determined at diamond 520 that the low period is at a value of K−1, the release of the IF detector low latched output reset occurs. As such, from this point forward, a detection of the IF signal that crosses the low threshold causes this latched output signal to again be set.

Still with reference to FIG. 4B, next at diamond 530 it is determined whether the passive network gain has changed. If so, an RF settling counter is set to a maximum value (e.g., R) (block 535). Instead if it determined that there is no passive network gain change and the RF settling counter is greater than zero (as determined at diamond 540), control passes to block 545 where the RF settling counter is decremented.

Next at diamond 560 it is determined whether there has been gain change. If so, a slow loop settling counter is set to its maximum value (e.g., P) at block 565. The slow loop is for performing fine tuning updates based on RSSI information. Note that this slow loop settling counter may be set to a much larger value than the other settling counters, as the settling time for a gain change to be resolved through the receiver chain to result in updated RSSI information is much longer than the time for receiver front end gain components settle.

Still with reference to FIG. 4B, if at diamond 570 it is determined that the slow loop settling counter is greater than zero, at block 575 this counter is decremented. Control next passes to FIG. 4C.

Figure 4C:
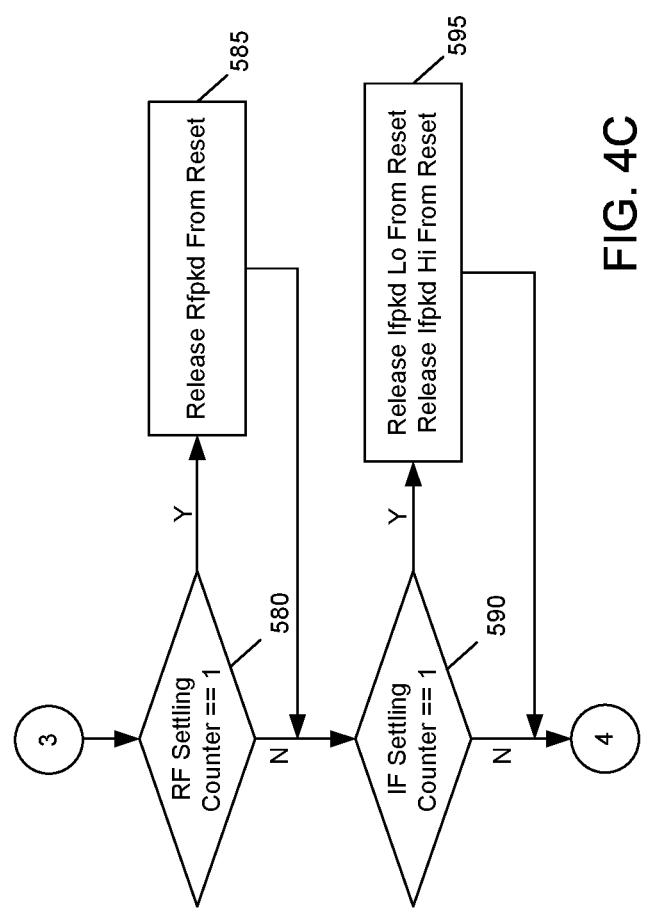

Specifically, FIG. 4C is a further portion of the gain control algorithm in which IF and RF detectors release from reset may occur (based on settling counter values). More specifically, at diamond 580 it is determined whether the RF settling counter is at a value near its completion (e.g., 1). If so, control passes to block 585 where the RF detector is released from reset, such that it may again provide a latched output on a detection of an RF sample that exceeds the RF threshold. At diamond 590, it is determined whether the IF settling counter is at a value near its completion (e.g., 1). If so, control passes to block 595 where both the IF detector low and high latched outputs are released from reset, such that they may again provide a latched output on a detection of an IF sample that exceeds the relevant IF threshold.

Figure 4D:
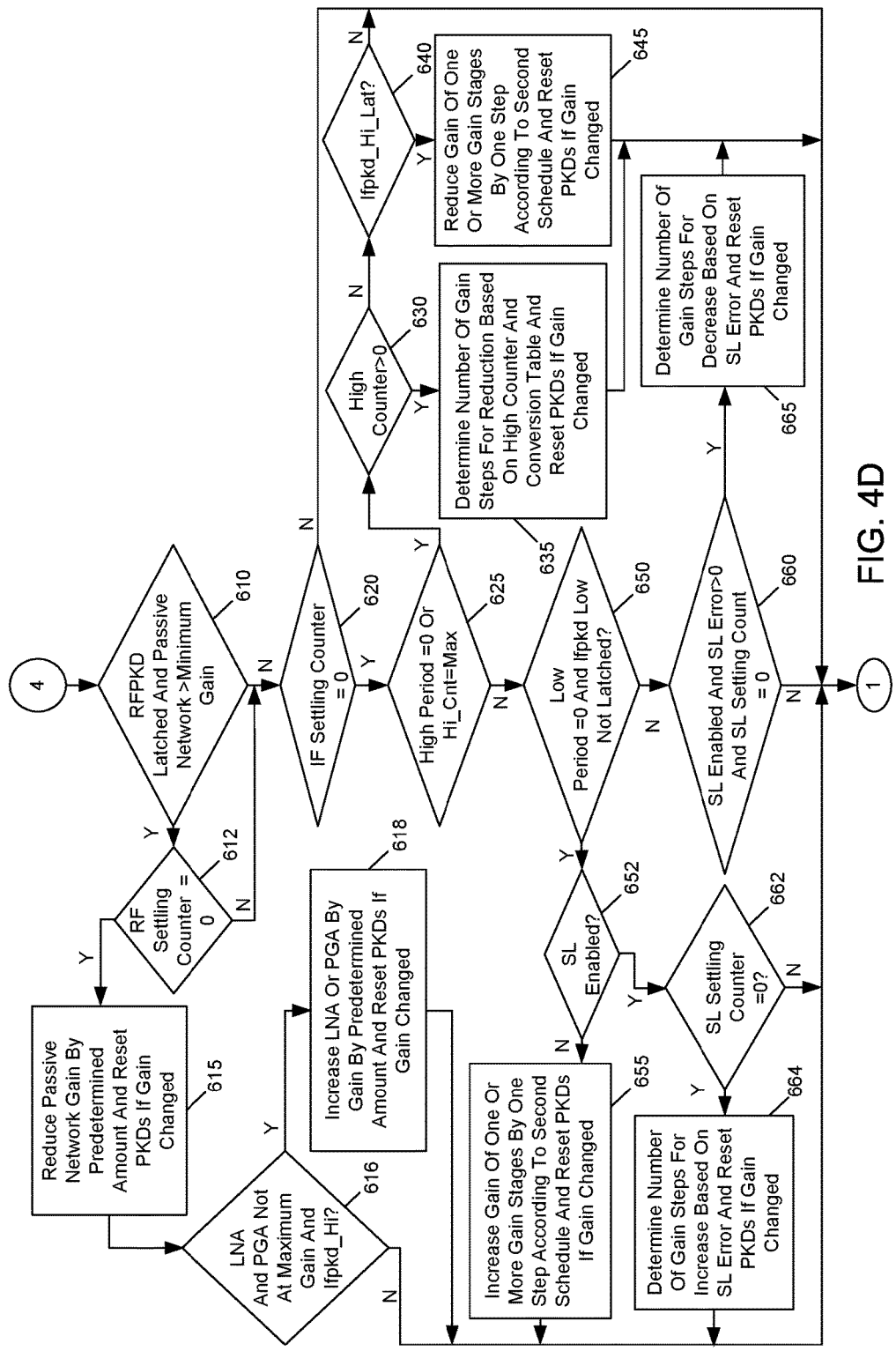

Note at this point of method 400, many counting based and preparatory actions have been taken, such that the main control loop for performing various gain updates may proceed. Referring now to FIG. 4D, shown are further operations in the AGC algorithm. Specifically as seen in FIG. 4D, at diamond 610 it is determined whether the RF detector is latched to a high value and whether the passive network gain setting is greater than its minimum gain. In embodiments, additional optional determinations may occur at this point, including whether RF gain control is enabled. Assuming all these determinations are in the affirmative, control passes to diamond 612 where it is determined whether the RF settling counter is at a zero value. If so, control passes to block 615 where the passive network gain may be reduced by a predetermined amount. In one embodiment, this predetermined amount is 6 dB. Further at block 615 if the gain is changed at this point, the detectors (both RF and IF) may be reset.

Still referring to FIG. 4D, next it is determined at diamond 616 whether the LNA and PGA are not at their maximum gain levels and the IF detector high threshold has been crossed (as determined by the high latched output from the IF detector). If this is the case, control passes to block 618 where the LNA or PGA gain may be increased by a predetermined amount. In addition, the IF and RF detectors may be reset. Note that this increase to these IF gain components may be in equal and opposite direction as the decrease in gain of the passive network performed above in block 615. In this way, it can be assured that even with the RF gain decrease, sufficient signal strength is present in the IF portion of the receiver to validly perform receive operations.

Still with reference to FIG. 4D, control proceeds from diamond 610 to diamond 620 to determine whether the IF settling counter is at a zero value. If so, control passes to diamond 625 to determine whether the high period is completed (namely at a value of zero) or the high counter value has reached its maximum level (which may be a programmable value in some embodiments). If this is the case, control passes to diamond 630 to determine whether the high counter exceeds a threshold value (e.g., zero in one embodiment). If so, control passes to block 635 where a number of gain steps to be incurred may be determined based on the high counter. As described above, in an embodiment a mapping table may be accessed to determine a non-linear mapping between this count value and the number of gain steps to take. Also at block 635, one or more gain components may have their gain settings reduced by this determined step amount. In addition at block 635 the IF and RF detectors may be reset if a gain change is effected.

Still with reference to FIG. 4D, if the high counter value does not exceed the threshold value (meaning there was no sample that exceeded the IF high threshold at any sampling instant during the high detection period), control passes to diamond 640 to determine whether the IF detector high latched output is active (meaning there was at least one trip of the IF high threshold). If this is the case, control passes next to block 645 where one or more gain components may be reduced by a gain setting of a single gain step. In addition at block 645 the RF and IF detectors may be reset if a gain change is effected.

With further reference to FIG. 4D, next at diamond 650 it is determined whether the low period has completed and the IF low peak detector did not latch. If this is the case, control passes to diamond 652 where it is determined whether the slow loop is enabled. If not, control passes next to block 655 where an increase to a gain setting of a given gain component by a single gain step is performed according to the second schedule. In addition at block 655 the RF and IF detectors may be reset if a gain change is effected.

Further as to FIG. 4D, at diamond 660 it is determined whether the slow loop is enabled and the slow loop settling counter equals zero. Further at diamond 660 it is determined whether the slow loop error value, which correspond to a difference between an estimated channel power level and a target power level is positive (meaning that the estimated channel power exceeds the target power level). If this is the case, control passes to block 665 where the number of gain steps for a decrease may be based on the slow loop error value. In addition, the RF and IF detectors may be reset if a gain change occurred. Note that in an embodiment, there may be a given relation between the slow loop error value and the gain reduction. For example, a slow loop error of 4 may correspond to a gain reduction of 2 dB. Similarly, a slow loop error value of 8 may correspond to a 4 dB gain reduction, and so forth.

Still with reference to FIG. 4D if at diamond 652 it is determined that the slow loop is enabled, control passes to diamond 662 to determine whether the slow loop settling counter equals 0. If so, control passes to block 664 where a number of gain steps for an increase may be determined based on the slow loop error value. As above, this determination may occur where the slow loop error value is positive, meaning that the estimated channel power is less than the target channel power. Understand while shown at this high level in FIGS. 4A-4D, many variations and alternatives are possible.

Figure 5:
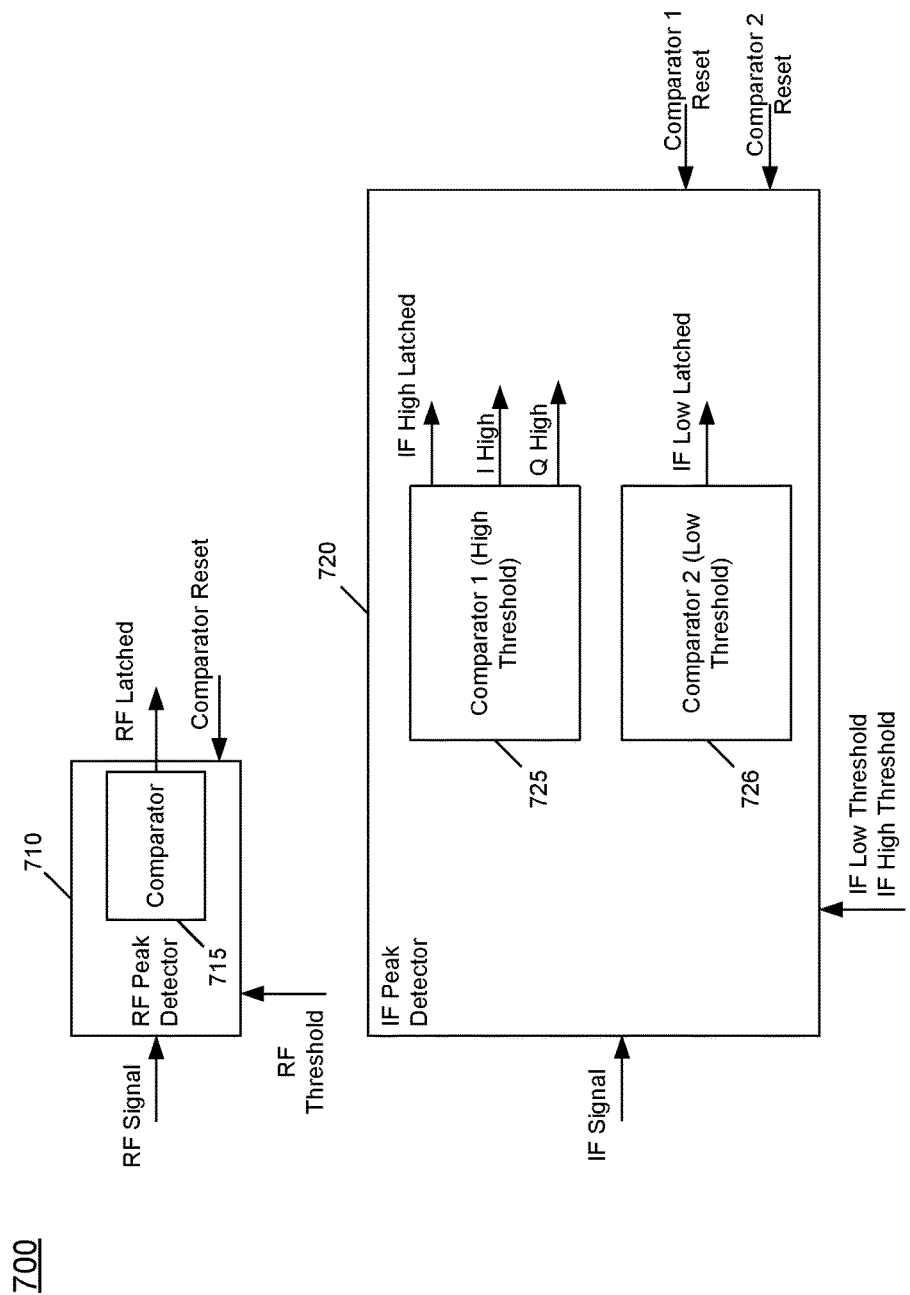
FIG. 5 is a block diagram of detection circuitry in accordance with an embodiment.

Referring now to FIG. 5, shown is a block diagram of detector circuitry in accordance with an embodiment. As shown in FIG. 5, a circuit 700, which may be implemented in various locations of a receiver, includes different hardware circuits to perform power detection at various points within a receiver chain. More specifically, a RF peak detector 710 is provided to detect a measure of incoming RF power based on a received RF signal. Although embodiments vary, in a particular embodiment this RF signal may be output from a point in a receiver chain just prior to amplification in an LNA. In addition, RF peak detector 710 further receives a threshold value, here an RF threshold. In turn, RF peak detector includes a comparator 715 to compare the incoming RF signal to this threshold level. If it is determined that the RF signal exceeds the RF threshold, a set signal is output, namely a latched output signal, RF latched. In embodiments, this signal is a latched signal, such that once set, remains at a logic high level until a comparator reset is received (which may be received from an AGC controller as described above). This detector output signal, RF latched, may thus be provided to an AGC controller or other control circuit to enable gain control operations to be performed based at least in part on this signal.

As further illustrated in FIG. 5, circuit 700 further includes an IF peak detector 720. In turn, IF peak detector 720 includes a first comparator 725 to compare the incoming IF signal to a high IF threshold level. If it is determined that the IF signal exceeds the high IF threshold, a set signal is output, namely a latched output signal, IF high latched. As further shown, first comparator 725 further outputs additional signals, namely high signals for both I and Q. More specifically, these signals are output from first comparator 725 whenever a sample of the IF signal provided to IF peak detector 720 exceeds the high IF threshold level at a sampling instance. Accordingly, when an in-phase IF signal exceeds this threshold, a first output signal is set (I high) and when a quadrature phase signal exceeds this threshold, a second signal is set (Q high). As described herein, these signals provided to AGC controller may cause the AGC controller to update a high counter. This counter value may then be used in AGC operations. IF peak detector 720 also includes a second comparator 726 to compare the incoming IF signal to a low IF threshold level. If it is determined that the IF signal exceeds the low IF threshold, a set signal is output, namely a latched output signal, IF low latched.

By use of both a latched output and a counter-based value, a blocker signal can be detected, even when it is at a frequency such that it is not detected by the IF detector at sampling intervals within the detection period. Comparators 725, 726 may be reset by receipt of corresponding comparator reset signals. More specifically, these reset signals may be received when a given detection period (namely a high detection period and a low detection period) complete. Understand while shown at this high level in the embodiment of FIG. 5, many variations and alternatives are possible. For example, in other cases the high counter may be implemented within the IF detector.

Figure 6:
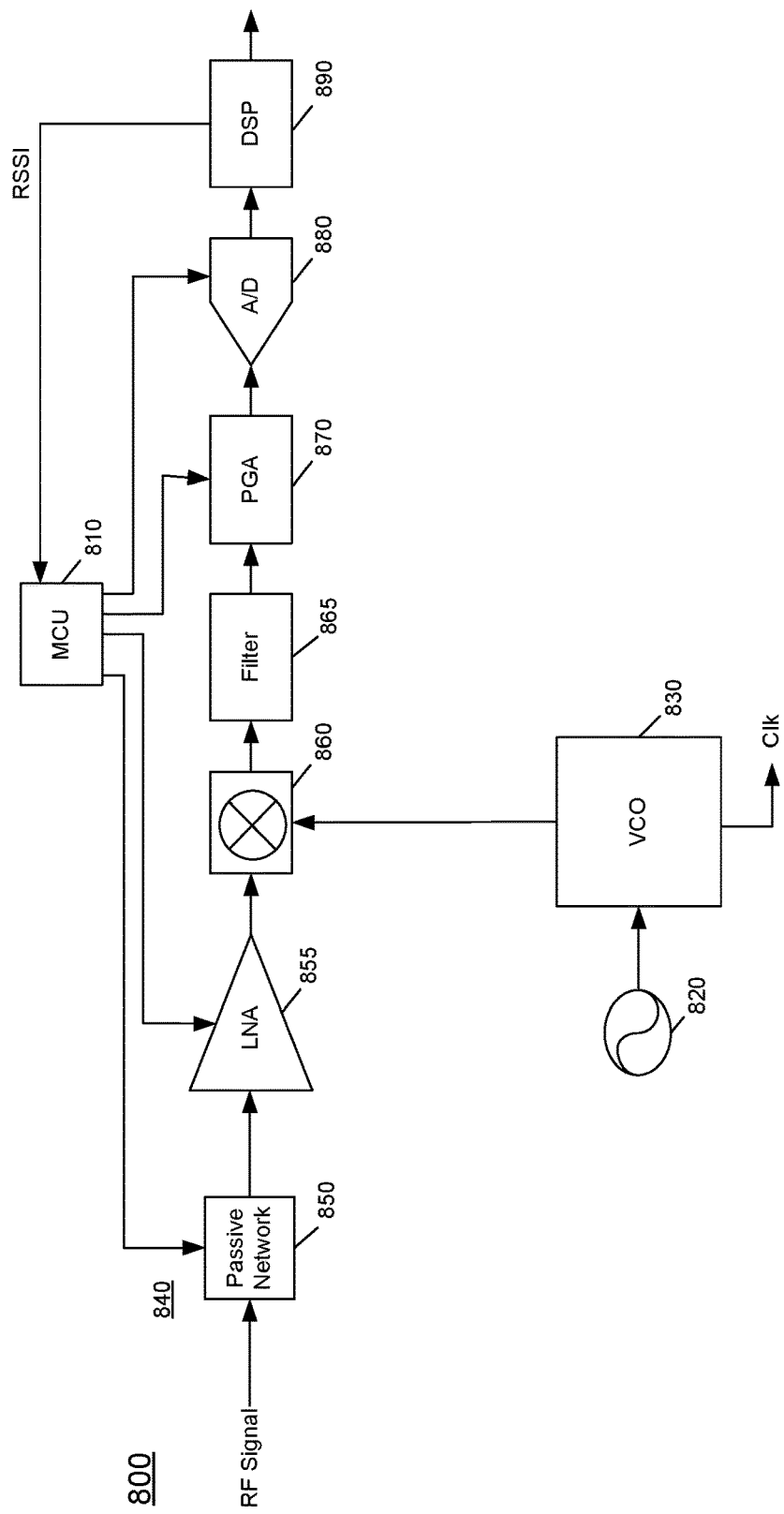
FIG. 6 is a block diagram of an integrated circuit including a receiver as described herein.

Referring now to FIG. 6, shown is a block diagram of an integrated circuit including a receiver having a controller to perform AGC updates as described herein. More specifically as illustrated in FIG. 6, integrated circuit 800 is a representative wireless transceiver such as a WiFi transceiver that may be used in many different types of applications. Of interest here, note that IC 800 includes a microcontroller unit (MCU) 810. In different embodiments, MCU 810 may be implemented as a general-purpose microcontroller that may perform various control operations with regard to the transceiver. More specifically for embodiments herein, MCU 810 may be configured to perform the AGC techniques. To this end, MCU 810 may include or may be coupled to a non-transitory storage medium that stores instructions that when executed enable MCU 810 to dynamically perform the gain control operations discussed herein.

As shown, a signal processing path 840 includes a passive network 850 which, in an embodiment may be implemented as an attenuator such as described above with regard to FIG. 1. As seen, gain control settings may be provided from MCU 810 to passive network 850 to dynamically update gain control settings during a preamble portion of a packet. Passive network 850 in turn is coupled to a LNA 855 to receive and condition an incoming RF signal. As illustrated, LNA 855 may receive gain control settings from MCU 810, as described herein. This conditioned signal in turn is provided to a mixer 860 that is configured to downconvert the incoming RF signal to a lower frequency signal.

In turn, the downconverted signal is output to an optional filter 865 that filters the downconverted signal. In turn, this filtered downconverted signal is provided to a PGA 870 and in turn to an ADC 880 for digitization. As seen, PGA 870 and ADC 880 are coupled to receive gain control settings from MCU 810 to perform the AGC techniques during a preamble portion of a packet as described herein. The resulting digitized signal is provided to a digital signal processor 890 that in turn may further process the incoming signal. Note that this digitized processed signal can be provided to appropriate downstream processing circuitry. And DSP 890 may send RSSI information to MCU 810 for use in performing slow loop gain updates.

In the embodiment shown, a voltage controlled oscillator (VCO) 830 receives a clock signal from a clock source 820 (which in some cases may be an off-chip clock source). In turn, VCO 830 generates one or more clock signals at a given operating frequency for use within IC 800. Of interest here, a divided version of an input clock signal (e.g., at 2.4 GHz) is provided to mixer 860 of signal processing path 840.

In a representative embodiment, the processed data output by DSP 890 can be provided to another integrated circuit, such as a microcontroller or other programmable circuitry that may process the signals accordingly. As an example, an IoT device including a wireless transceiver such as a sensor, monitor or so forth, can be used to measure information or provide user input and communicate such user input via a transmit signal processing path of integrated circuit 800 (not shown for ease of illustration in FIG. 6). In turn, these IoT-communicated signals can be received by another device such as a hub device within a given IoT system, which may in turn communicate the signals, via a central hub computer or so forth, to an Internet-based destination such as a server.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A receiver comprising:
    a low noise amplifier (LNA) to receive and amplify a radio frequency (RF) signal, the LNA having a first controllable gain;
    a mixer to downconvert the RF signal to an intermediate frequency (IF) signal;
    a programmable gain amplifier (PGA) coupled to the mixer to amplify the IF signal, the PGA having a second controllable gain;
    a digitizer to digitize the IF signal to a digitized signal;
    a digital signal processor (DSP) to process the digitized signal;
    a first detector to output:
        a first detection signal having a first value in response to the IF signal exceeding a first threshold during a first detection period;
        a second detection signal having the first value in response to the IF signal exceeding a second threshold during a second detection period, the second threshold less than the first threshold; and
        a third detection signal having the first value in response to a sample of the IF signal that exceeds the first threshold; and
    a controller to dynamically update a gain setting of one or more of the LNA and the PGA in response to one or more of the first detection signal, the second detection signal and the third detection signal.

2. The receiver of claim 1, wherein the controller is further to dynamically update the gain setting of the one or more of the LNA and the PGA based on received signal strength indication information obtained from the DSP.

3. The receiver of claim 1, further comprising a second detector to output a fourth detection signal having the first value in response to the RF signal exceeding a third threshold during a third detection period.

4. The receiver of claim 3, further comprising a passive gain network coupled to receive the RF signal from an antenna, wherein the controller is further to update a gain setting of the passive gain network, based on the fourth detection signal.

5. The receiver of claim 4, wherein the controller is to further update the gain setting of the one or more of the LNA and the PGA in an opposite direction to the update to the passive gain network gain setting.

6. The receiver of claim 3, wherein the controller is to disable the second detector.

7. The receiver of claim 1, wherein the first detection period is shorter than the second detection period.

8. The receiver of claim 1, wherein the controller is to dynamically update the gain setting of the one or more of the LNA and the PGA in a first direction in response to the second detection signal having a second value in response to the IF signal not exceeding the second threshold during the second detection period.

9. The receiver of claim 8, wherein the controller is to dynamically update the gain setting of the one or more of the LNA and the PGA in the first direction in response to the first detection signal having the second value in response to the IF signal not exceeding the first threshold during the first detection period.

10. The receiver of claim 1, wherein the controller is to maintain a count based on a number of instances of the third detection signal having the first value during the first detection period.

11. The receiver of claim 10, wherein the controller is to:
access a conversion table based on the count to obtain a number of gain steps; and
access a storage to determine a gain setting of one or more of the LNA and PGA based on the number of gain steps.

12. The receiver of claim 10, wherein the controller is to dynamically update the gain setting prior to a conclusion of the first detection period in response to the count reaching a maximum value.

13. The receiver of claim 1, wherein the controller is to disable the dynamic update in response to detection of a frame within the digitized signal.

14. At least one non-transitory computer readable storage medium comprising instructions that when executed enable a system to:
at a beginning of a packet communication, set a maximum gain setting for a plurality of gain components of a receiver; and
during a preamble portion of the packet communication, reduce a gain setting for one or more of the plurality of gain components in response to:
a count value exceeding a first count threshold, the count value corresponding to a number of samples of the packet communication within a first detection period that exceeds a first threshold;
a latched output signal to indicate that the packet communication exceeded the first threshold within the first detection period, if the count value does not exceed the first count threshold; and
reduce a gain setting for a first gain component of the plurality of gain components in response to a second latched output signal to indicate that the packet communication exceeded a second threshold within a second detection period.

15. The at least one non-transitory computer readable storage medium of claim 14, further comprising instructions that when executed enable the system to access a conversion table based on the count value to determine a number of gain steps for the gain setting reduction.

16. The at least one non-transitory computer readable storage medium of claim 14, further comprising instructions that when executed enable the system to access a first schedule to identify an updated gain setting for the one or more of the plurality of gain components.

17. An apparatus comprising:
a radio frequency (RF) front end circuit to receive and process a RF signal, the RF front end circuit having a first controllable gain;
a downconverter to downconvert the RF signal to a second frequency signal;
a programmable amplifier coupled to the downconverter to amplify the second frequency signal, the programmable amplifier having a second controllable gain;
a digitizer to digitize the second frequency signal to a digitized signal;
a digital signal processor (DSP) to process the digitized signal;
a first detector to output a first detection signal having a first value in response to a sample of the second frequency signal exceeding a first threshold;
a second detector to output a second detection signal having the first value in response to the RF signal exceeding a second threshold;
a first counter to maintain a count of a number of the first detection signals having the first value; and
a controller to dynamically update a gain setting of at least one of the RF front end circuit and the programmable amplifier in a first direction in response to the count being below a first count threshold and to update the gain setting of the at least one of the RF front end circuit and the programmable amplifier in a second direction in response to the count exceeding a second count threshold, wherein the controller is to access a first schedule based at least in part on the count to determine the gain setting update, and access a second schedule based at least in part on the second detection signal having the first value to determine a further update to the gain setting of the RF front end circuit.

* * * * *